United States Patent
Hua et al.

(10) Patent No.: US 7,436,058 B2
(45) Date of Patent: Oct. 14, 2008

(54) REACTIVE SOLDER MATERIAL

(75) Inventors: Fay Hua, San Jose, CA (US); Carl L. Deppisch, Phoenix, AZ (US); Krista J. Whittenburg, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/141,735

(22) Filed: May 9, 2002

(65) Prior Publication Data

US 2003/0209801 A1 Nov. 13, 2003

(51) Int. Cl.
*H01L 23/12* (2006.01)
*H01L 23/10* (2006.01)
*H01L 29/40* (2006.01)
*H01L 21/00* (2006.01)

(52) U.S. Cl. .......... 257/707; 257/704; 257/706; 257/781; 257/783; 438/118; 438/119; 438/122

(58) Field of Classification Search .......... 257/718, 257/719, 720, 706–709, 712, 675, 796, 722, 257/753, 783, 778

See application file for complete search history.

(56) References Cited

U.S. PATENT DOCUMENTS

| | | | |
|---|---|---|---|
| 3,766,977 A * | 10/1973 | Pravda et al. .......... 165/47 |
| 3,883,946 A | 5/1975 | Dale |
| 3,949,118 A | 4/1976 | Nagano et al. |
| 4,081,825 A * | 3/1978 | Koopman et al. .......... 257/713 |
| 4,872,047 A * | 10/1989 | Fister et al. .......... 357/67 |
| 5,387,815 A * | 2/1995 | Nishiguchi .......... 257/704 |
| 5,396,403 A | 3/1995 | Patel |
| 5,532,513 A * | 7/1996 | Smith et al. .......... 257/703 |
| 5,913,104 A | 6/1999 | Piper et al. |
| 6,047,876 A * | 4/2000 | Smith .......... 228/111.5 |
| 6,133,071 A | 10/2000 | Nagai |
| 6,231,693 B1 | 5/2001 | Lugscheider et al. |
| 6,292,367 B1 * | 9/2001 | Sikka et al. .......... 361/705 |
| 6,342,407 B1 * | 1/2002 | Goldmann et al. .......... 438/124 |
| 6,361,742 B2 | 3/2002 | Takeda et al. |
| 6,437,240 B2 * | 8/2002 | Smith .......... 174/541 |
| 6,461,891 B1 * | 10/2002 | Dishongh et al. .......... 438/106 |
| 6,472,762 B1 * | 10/2002 | Kutlu .......... 257/778 |
| 6,534,859 B1 * | 3/2003 | Shim et al. .......... 257/706 |
| 6,706,219 B2 | 3/2004 | Nguyen |

(Continued)

FOREIGN PATENT DOCUMENTS

JP 06-107471 * 4/1994

OTHER PUBLICATIONS

PCT Search Report PCT/US 03/10485—mailed Apr. 27, 2004, 8 pages (citing four (4) U.S. Patents listed above).

*Primary Examiner*—Carl Whitehead, Jr.
*Assistant Examiner*—James Mitchell
(74) *Attorney, Agent, or Firm*—Blakely, Sokoloff, Taylor & Zafman LLP

(57) ABSTRACT

Reactive solder material. The reactive solder material may be soldered to semiconductor surfaces such as the backside of a die or wafer. The reactive solder material includes a base solder material alloyed with an active element material. The reactive solder material may also be applied to a portion of a thermal management device. The reactive solder material may be useful as a thermally conductive interface between a semiconductor surface and a thermal management device.

9 Claims, 6 Drawing Sheets

U.S. PATENT DOCUMENTS

| | | | |
|---|---|---|---|
| 6,767,765 B2 | 7/2004 | Chiu | |
| 6,767,819 B2 * | 7/2004 | Lutz | 438/614 |
| 6,773,963 B2 * | 8/2004 | Houle | 438/122 |
| 7,042,084 B2 | 5/2006 | Takeuchi | |
| 7,126,218 B1 * | 10/2006 | Darveaux et al. | 257/706 |
| 2001/0000321 A1 * | 4/2001 | Takeda et al. | 420/560 |
| 2001/0013655 A1 * | 8/2001 | Smith | 257/741 |
| 2001/0024724 A1 * | 9/2001 | McCullough | 428/408 |
| 2001/0026957 A1 * | 10/2001 | Atwood et al. | 438/122 |
| 2001/0032719 A1 * | 10/2001 | Kim et al. | 165/185 |
| 2001/0038093 A1 * | 11/2001 | Nguen | 252/502 |
| 2002/0000239 A1 * | 1/2002 | Sachdev et al. | 134/2 |
| 2002/0041036 A1 * | 4/2002 | Smith | 257/778 |
| 2002/0106528 A1 * | 8/2002 | Jin et al. | 428/610 |
| 2002/0141155 A1 * | 10/2002 | Pinneo | 361/688 |
| 2002/0154485 A1 * | 10/2002 | Hill et al. | 361/704 |
| 2003/0034557 A1 * | 2/2003 | Gupta et al. | 257/729 |
| 2003/0077478 A1 * | 4/2003 | Dani et al. | 428/673 |
| 2003/0127715 A1 * | 7/2003 | Liu et al. | 257/678 |
| 2003/0134454 A1 * | 7/2003 | Houle | 438/122 |
| 2003/0160319 A1 * | 8/2003 | Zheng et al. | 257/712 |
| 2003/0173051 A1 * | 9/2003 | Rinella et al. | 164/113 |
| 2003/0183909 A1 * | 10/2003 | Chiu | 257/667 |

* cited by examiner

REACTIVE SOLDER MATERIAL

BACKGROUND

Embodiments described relate to the attachment of devices to a semiconductor die. In particular, embodiments described here relate to thermal management device attachment to a semiconductor die with a solder material.

BACKGROUND OF THE RELATED ART

In the fabrication of microchips or dice, semiconductor wafers are processed and sliced into individual dice. The dice may then be used in a wide variety of devices. For example, a die may be used in an electronic device by being electronically coupled to a printed circuit board (PCB) of the device. However, prior to such an electronic coupling a thermal management device such as an integrated heat spreader (IHS) is often attached to a surface of the die. The IHS may help ensure that any heat within the die is adequately dissipated to prevent damage to the die during operation.

In order to attach a thermal management device to a die, an adhesive is placed at a surface of the die and the device placed atop the adhesive. Adhesives may be of conventional polymers, such as siloxane-based polymers, or other conventional thermally conductive adhesive material.

The ability of an IHS to dissipate heat from the die is dependent in part upon the IHS material selected. Highly efficient heat dissipating materials such as aluminum and copper may be employed. However, the ability of the IHS to dissipate heat from the die is also dependent upon the adhesive which secures the IHS to the die. That is, heat transfer from the die to the IHS is limited by the conductivity of the adhesive between the IHS and the die. Therefore, for example, even where an IHS of a highly efficient heat dissipating material is employed, the effectiveness of the IHS will nevertheless be substantially compromised where the adhesive is of a relatively low conductivity.

In order to more effectively transfer heat, solder materials may be used as a thermal interface. Solder materials, such as indium, are of generally higher conductivity than conventional polymer adhesives. However, solder materials require a metallized surface, flux, and other processing for complete curing and bonding to an otherwise silicon-based non-metal surface. Metallization incurs additional processing time and equipment. Additionally, a conventional solder, such as indium will require the addition of a flux material to clean soldering surface and encourage solder flow. The flux may be delivered by a syringe of yet another piece of equipment. Flux delivery also incurs additional processing time and is required for bonding of conventional solder material to the metallized surface. Solder material is then dispensed above the flux before the heat management device is placed.

While conventional solder materials display better conductivity, they also require a longer and less efficient process than processes already available for use of conventional polymer adhesives. Additional equipment cost and expense associated with reduced throughput is also incurred.

DETAILED DESCRIPTION

Descriptions of reactive solder materials and semiconductor package embodiments follow. Packaging methods incorporating reactive solder material embodiments are disclosed. Aspects of embodiments are described and illustrated by the accompanying drawings.

While embodiments are described with reference to particular die and certain packages, the embodiments are applicable to any process for securing a thermal management device to a semiconductor surface such as the surface of a die or wafer. Embodiments can be particularly useful when a thermal management device in the form of an IHS is to be secured to the backside of a packaged die. Embodiments include a method of applying a reactive solder material to a surface of a die and bonding thereto by reflow.

Figure 1:
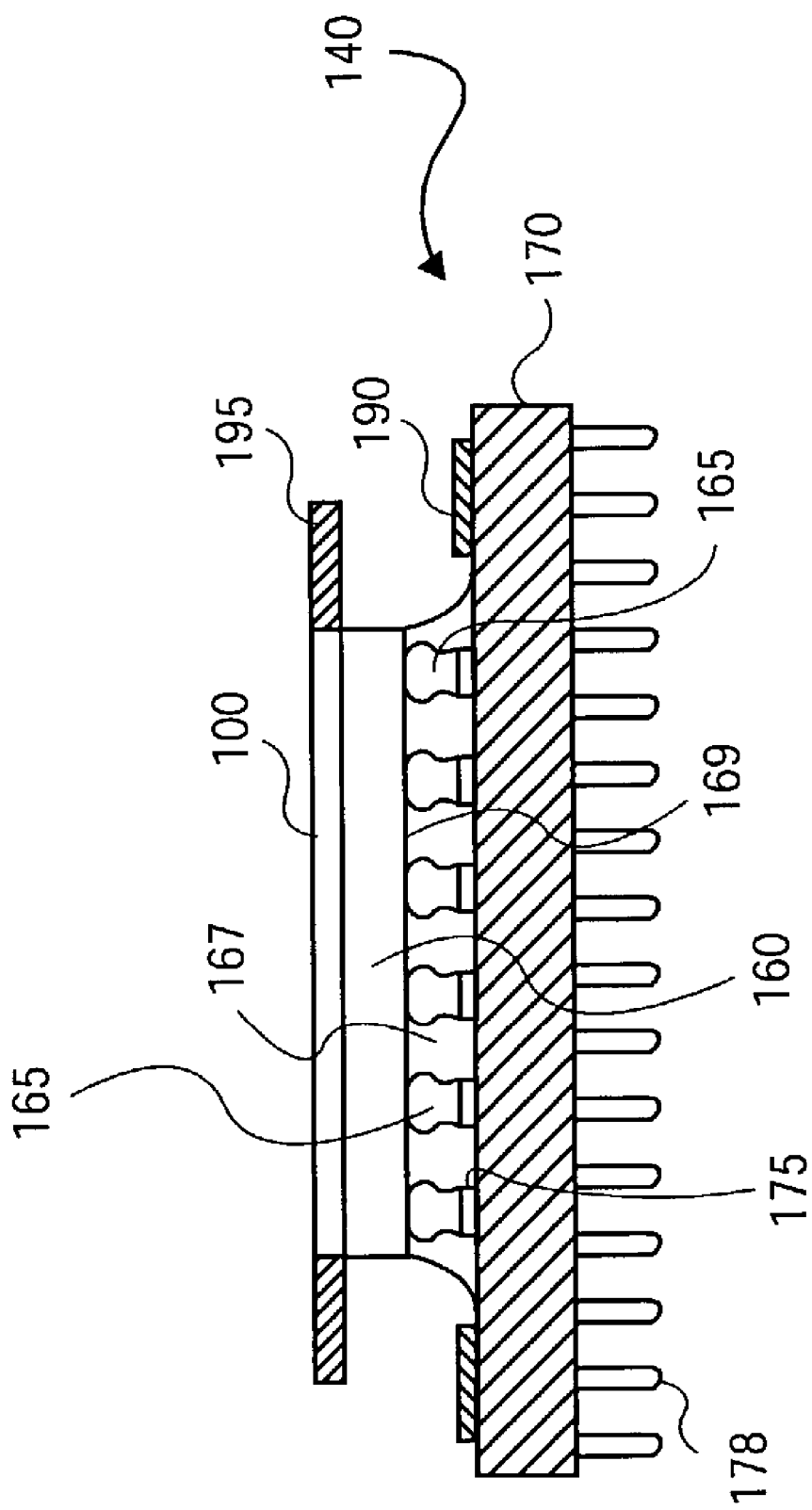
FIG. 1 is a side cross-sectional view of a semiconductor package with a solder preform placed thereon.

Referring now to FIG. 1, a semiconductor package 140 is shown accommodating a preform 195 includes a portion that is reactive solder material 100 delivered to a semiconductor surface of the semiconductor package 140. In alternate embodiments, reactive solder material 100 may be delivered in alternate manners. For example, solder ribbon or other conventional solder delivery mechanisms may be employed.

Figure 6:
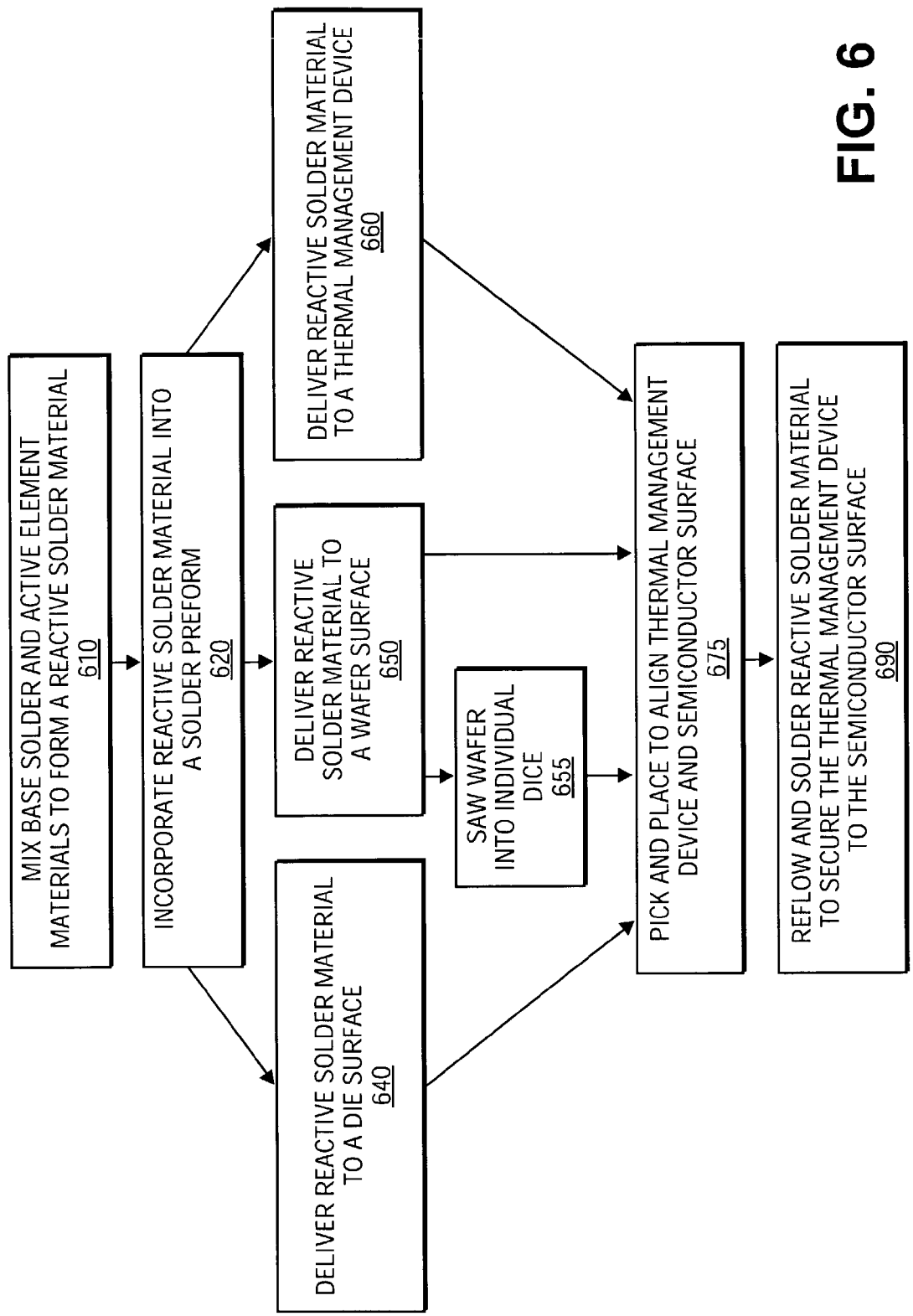
FIG. 6 is a flow chart summarizing certain embodiments of securing a thermal management device to a semiconductor surface.

FIG. 6 depicts a flow-chart summarizing certain embodiments described herein, where a thermal management device is secured to a semiconductor surface by way of a reactive solder material 100 (see FIG. 1). FIG. 6 is referenced throughout the following description as an aid in describing these embodiments.

Continuing with reference to FIG. 1, with additional reference to FIG. 6, the reactive solder material 100 is initially formed by mixing into a liquid form of a base solder material, an active element material 610. An active element material is a material that may combine with a base solder material without significantly impacting the melting point of the reactive solder material while also having the ability to bond directly to a silicon based material or surface. Active element materials may include rare earth, transition, and other elements as described further herein. The reactive solder material 100 is incorporated into a solder preform 195 (620) aligned with a semiconductor surface which is a surface 162 of a die 160. Delivery of the solder preform 195 in this manner may be accomplished with a conventional pick and place mechanism.

In embodiments described, a semiconductor surface is the backside surface of a die 160 as shown in FIG. 1 or an entire wafer backside surface. However it is not required that the semiconductor surface be a backside surface or that the die 160 be of a semiconductor package 140. Additionally, as described further herein, and with reference to FIG. 6, embodiments of the reactive solder material 100 may be delivered to a surface 162 of a die 160 (see also 640), a wafer surface 650, or a thermal management device 660. Additionally, the reactive solder material may be delivered to other silicon based or oxide surfaces for bonding as described further herein.

As described further herein, the reactive solder material 100 is to act as an adhesive with high conductivity. Additionally, the reactive solder material 100 includes properties that allow for the securing of a thermal management device to the die 160 in an efficient manner without sacrifice of advantages afforded by the high conductivity of the reactive solder material 100.

In the embodiment shown, the die 160 is of a monocrystaline silicon to act as a platform for an arrangement of transistors and capacitors including metal lines for electrical coupling separated by inter-layer dielectric material. Additionally, as shown, an electrical contact surface 169 of the die 160 includes electrically conductive bumps 165 coupled to the inner circuitry of the die 160. In one embodiment, the electrically conductive bumps are of a tin lead solder. However, in other embodiments lead free solder and other conventional materials are used. In the embodiment shown, the die 160 also includes a surface 162 that is not metallized. As described further herein, metallization of this surface 162 is not required for bonding of reactive solder material 100.

In the embodiment shown in FIG. 1, the semiconductor package 140 is formed by placement of the die 160 above the package substrate 170, for example, by a conventional pick and place mechanism. The die 160 is placed such that the electrically conductive bumps 165 are in contact with electrically conductive pads 175 of the package substrate 170. The semiconductor package 140 is then heated in a conventional oven to melt the electrically conductive bumps 165 about the electrically conductive pads 175. For example, in embodiments where the electrically conductive bumps 165 are of a tin lead, lead free, or other conventional solder, the semiconductor package 140 is heated to between about 180° C. and about 225° C. Once secure electrical contact between the electrically conductive bumps 165 and the electrically conductive pads 175 occurs, the semiconductor package 140 is cooled to allow the electrically conductive bumps 165 to solidify and permanently affix to the electrically conductive pads 175.

The semiconductor package 140 is then placed in an underfill delivery device where a syringe is used to deliver an underfill material 167 filling the space between the die 160 and the package substrate 170. The semiconductor package 140 is then placed in a reflow apparatus for heating and curing of the underfill material 167. In one embodiment, the underfill material 167 is of a polymer adhesive, such as a conventional epoxy which is heated to between about 125° C. and about 225° C. by the reflow apparatus for curing.

As shown in the embodiment of FIG. 1, the package substrate 170 includes conductive pins 178 which are electrically coupled to the electrically conductive bond pads 175. This allows access to the circuitry of the die 160 by any devices coupled to the semiconductor package 140 through the conductive pins 178. In other embodiments a ball grid array or other conductive mechanism may be used in place of the conductive pins 178 and bond pads 175 for electrical coupling.

A sealant 190 may be delivered about the perimeter of the die 160 at the surface of the package substrate 170. The sealant 190 may be a conventional epoxy polymer delivered with use of a syringe followed by curing similar to the underfill as described above and further herein.

Continuing with reference to FIG. 1, including the reactive solder material 100, a solder preform 195 may be placed as shown, above the surface 162 of the die 160 by a conventional pick and place mechanism. The solder preform 195 is positioned such that the reactive solder material 100 is at the surface 162 of the die 160. In an alternate embodiment, a heated molten form of the reactive solder material 100 is delivered to the surface 162 of the die 160. Additionally, in the embodiment shown, the sealant 190 may help secure an integrated heat spreader (IHS) 300 (see FIG. 3) during reflow as described below.

As noted above, embodiments of the reactive solder material 100 include properties that allow for soldering in a highly efficient manner. In particular, as described below, the reactive solder material 100 melts and solidifies without pre-flux cleaning and does not require a metal surface for sufficient bonding. Therefore, the expense of metallization is avoided. Additionally, since no flux is needed for soldering, the likelihood of forming trapped flux or voids, which could decrease conductivity, is minimized.

As described above, embodiments of reactive solder material 100 include a base solder alloyed with an active element material. Base solders may include indium, tin silver, and other conventional thermal conductive solder types. Active element materials may include rare earth elements such as hafnium, cerium, titanium and lutetium, transition elements such as nickel, copper, iron, and cobalt, and other elements such as magnesium, strontium and cadmium. Alloyed into the base solder is less than about 10% of an active element material, preferably less than about 2%. In this manner, the active element material does not significantly affect or increase a solidus temperature of the reactive solder material 100. Additionally, a liquidus temperature of the reactive solder material 100 will not exceed about 300° C.

By including an active element material in the reactive solder material 100 as described above, the reactive solder material 100 becomes naturally reactive with materials at the surface 162 of the silicon die 160 such as silicon, silicon oxide or silicon nitride. As described further herein, this provides a unique bond of solder to the die 160 following reflow that is not disturbed or compromised in conductivity by the addition of flux.

Figure 2:
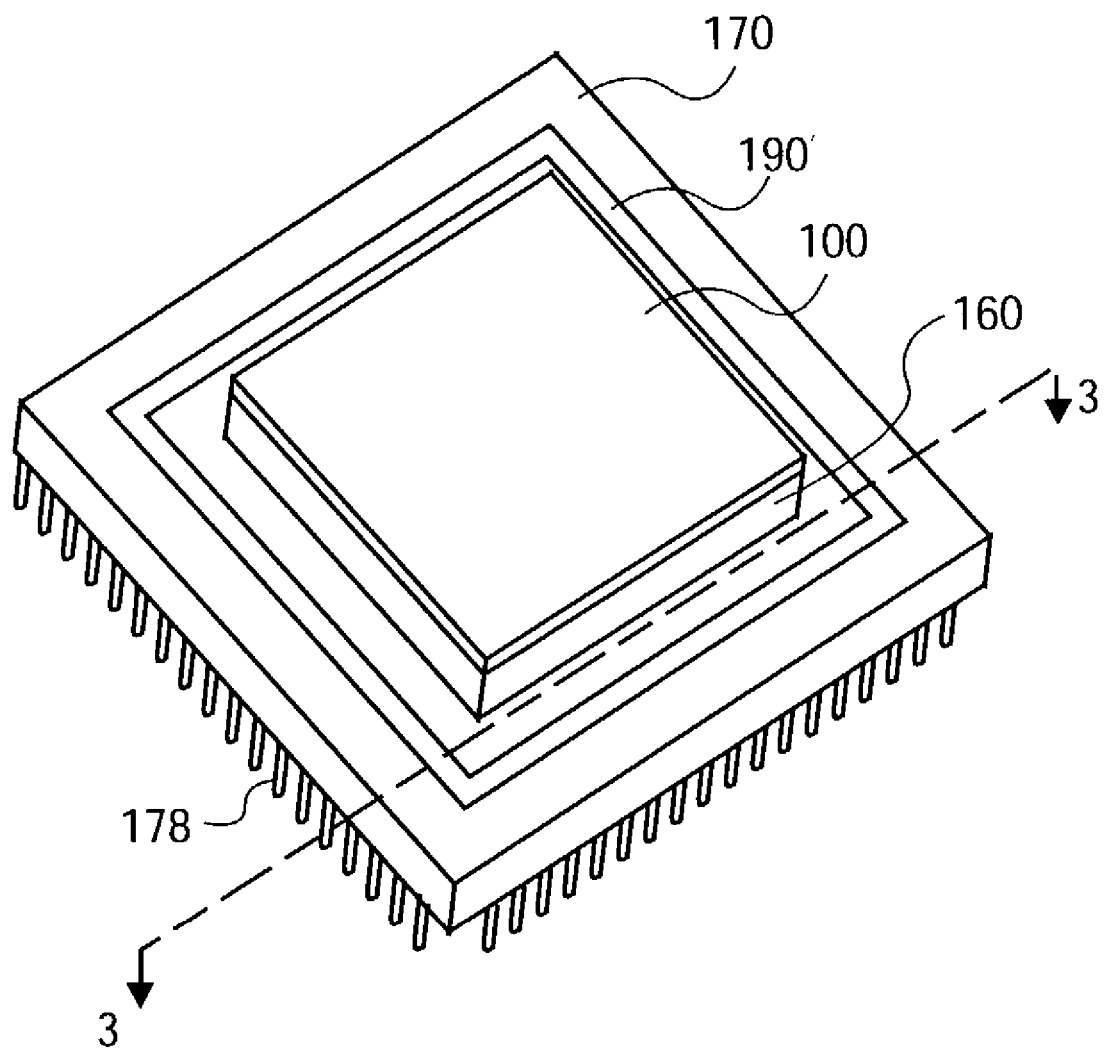
FIG. 2 is a perspective view of the semiconductor package of FIG. 1 including a reactive solder material layer.

Referring to FIGS. 1 and 2, a layer of reactive solder material 100 is delivered to the surface 162 of the die 160. The remainder of the solder preform 195 and any excess reactive solder material 100 thereon is removed, leaving behind the layer of reactive solder material 100.

Figure 3:
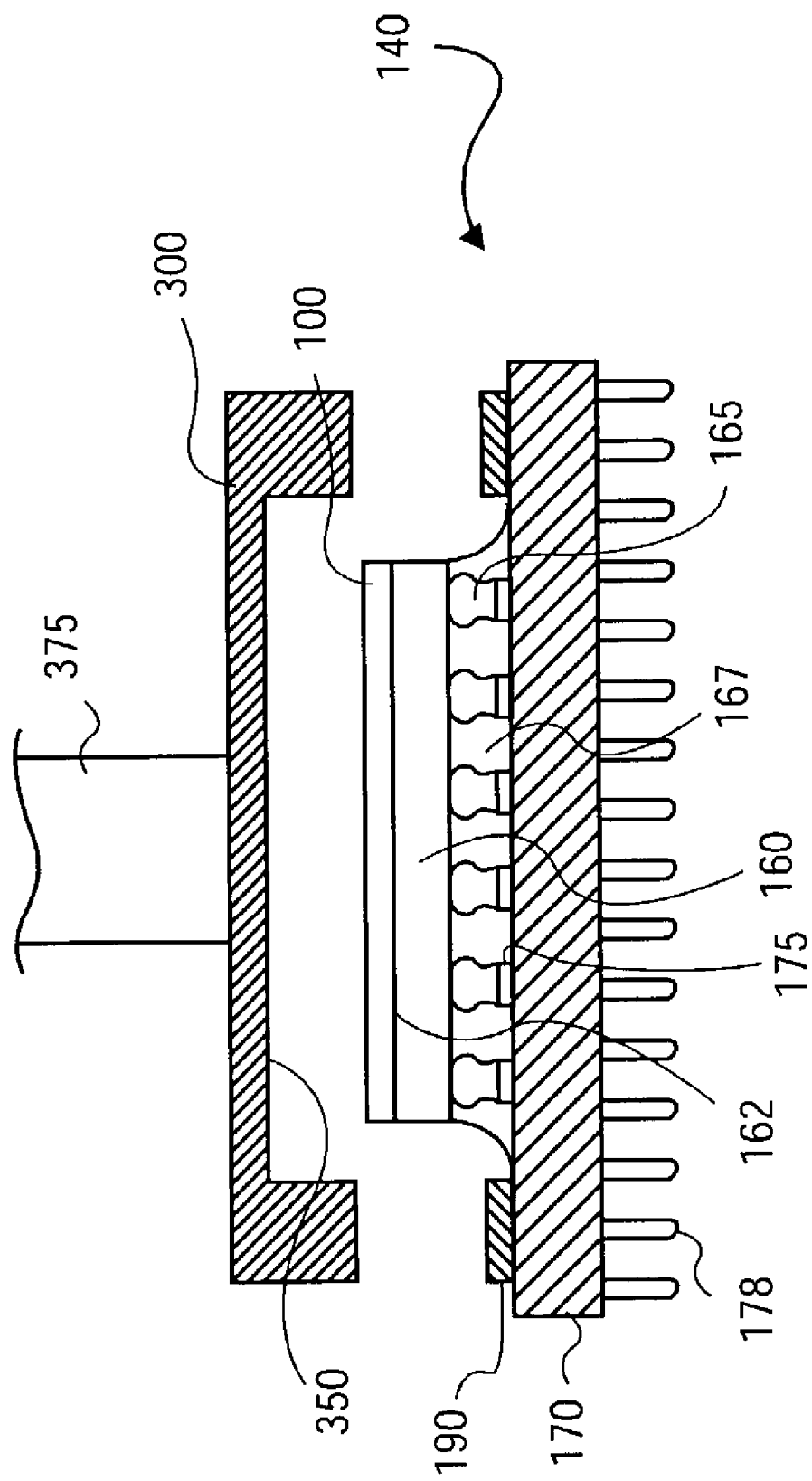
FIG. 3 is a side cross-sectional view of the semiconductor package of FIG. 2 to accommodate an IHS placed by a pick and place device.

Referring to FIG. 3, a side cross-sectional view of the semiconductor package 140 taken from section lines 3-3 of FIG. 2 is shown. With additional reference to 675 of FIG. 6, an arm 375 of a pick and place device aligns and delivers a thermal management device, such as an IHS 300 to the semiconductor package 140. The IHS 300 may help ensure that any heat within the die 160 is adequately dissipated to prevent damage to the die 160 during its operation.

Embodiments of thermal management devices such as the IHS 300 may be of copper, diamond, silicon carbide, aluminum nitride, or other conventional heat management material with a bonding surface 350 to bond to the reactive solder material 100. The bonding surface 350 may be of a nickel gold, or other metal material. In an embodiment where the IHS 300 is of a material reactive with the reactive solder material 100, such as a metal, the bonding surface 350 need not be metalized, for example, with gold for sufficient bonding to the reactive solder material 100.

In the embodiment shown, the thermal management device is an IHS 300. However, other thermal management devices such as heat sinks or other features may be coupled to the die 160 or one another as described above, through the reactive solder material 100 interface.

As shown in FIG. 3, the bonding surface 350 of the IHS 300 is placed above the surface 162 of the die 160 with the layer of reactive solder material 100 serving as an interface therebetween. Additionally, portions of the bonding surface 350 extending beyond the width of the die 160 contact the sealant 190 adjacent the die 160 as the IHS 300 is placed by the arm 375. However, it is not required that these portions of the bonding surface 350 be coated with solderable metals as indicated.

Figure 4:
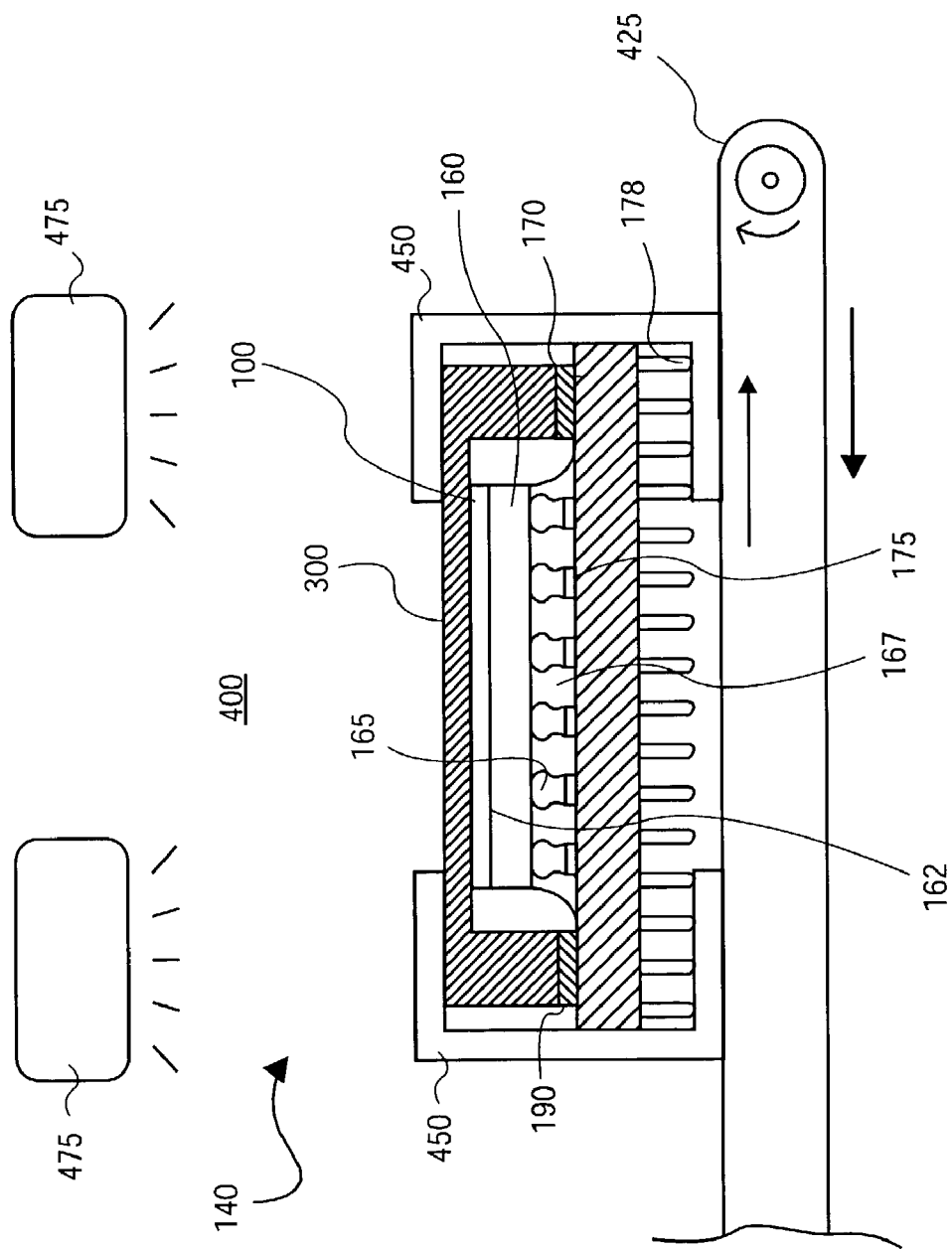
FIG. 4 is a side cross-sectional view of the semiconductor package of FIG. 3 in a reflow apparatus.

Referring to FIG. 4, an embodiment of the semiconductor package 140 including the IHS 300 is secured by clips 450. The clips 450 force the IHS 300 and the remainder of the semiconductor package 140 together. In the embodiment shown, the pressure applied by the clips is between about 5 lbs. and about 16 lbs. However, the exact pressure applied by the clips 450 may be dependent upon factors such as the makeup of the reactive solder material 100 and is a matter of design choice.

With reference to FIG. 6, reflow is used to solder the reactive solder material 100 and bond a device to a semiconductor surface 690. With particular reference to FIG. 4, this is seen where the clipped semiconductor package 140 is placed within a reflow apparatus 400 and advanced along a belt 425. The reflow apparatus 400 may be a conventional semiconductor processing oven. The heating elements 475 may include heated coils, a radio frequency source, or other source of radiation.

As the semiconductor package 140 is advanced the heating elements 475 melt the reactive solder material 100 to bond the die 160 to the IHS 300. The heating elements 475 heat the reactive solder material 100 up to the melting point of the base solder. For example, in an embodiment where the base solder is indium, the heating elements 475 heat the reactive solder material 100 up to at least 156° C., preferably below 200° C. Depending upon the base solder utilized, the reactive solder material 100 may be heated up to about 300° C. to ensure reliable bonding. The right reactive elements will not change bonding temperature significantly.

During reflow, as described above, active elements within the reactive solder material 100 dissolve and migrate to the silicon surface 162 of the die 160 boding thereto. At the same time, the base solder bonds directly to the IHS 300. It is not necessary that the surface 162 be metalized prior to soldering. The solder joint formed by the reactive solder material 100 will display a bond strength of between about 1,000 psi and about 2,000 psi.

Figure 5:
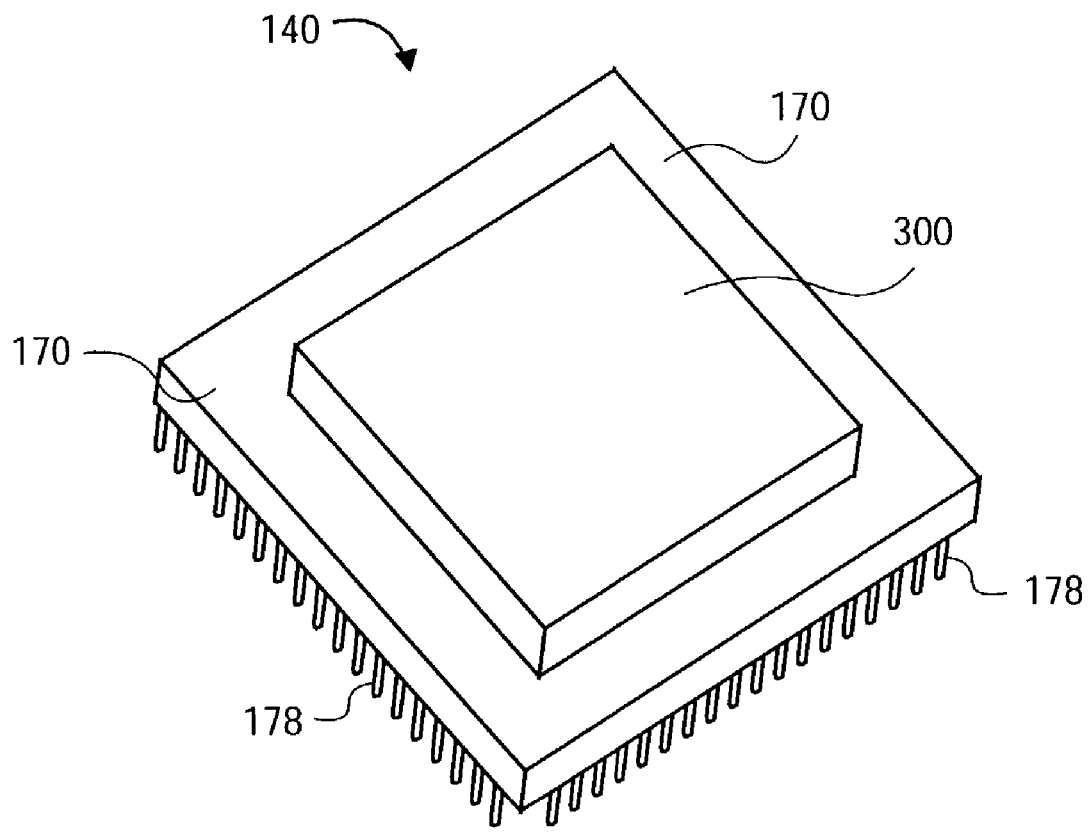
FIG. 5 is a perspective view of the semiconductor package of FIG. 4 following reflow.

Referring to FIG. 5, a perspective view of the semiconductor package 140 is shown. The semiconductor package 140 is shown removed from the reflow apparatus 400 and clips 450 of FIG. 4. The IHS 300 is secured and shown in contact with the sealant 190 about its perimeter. The sealant 190 may be a conventional polymer and may cure when heated to between about 100° C. and about 150° C. For example, in an embodiment where the base solder is indium and reflow is used to heat up the reactive solder material 100 to about 156° C., the sealant 190 is cured during the reflow. In an alternate embodiment the sealant 190 is not present. Rather, additional reactive solder material 100 is provided to seal about the perimeter of the die 160 and be soldered during reflow as described above.

The semiconductor package 140 shown in FIG. 5 is ready for connection to a printed circuit board of an electronic device. Due to the conductivity displayed by the cured reactive solder material 100 (see FIG. 4), heat generated throughout the die 160 during operation of the electronic device is dissipated by the IHS 300. The semiconductor package 140 shown is formed by processes having a degree of efficiency heretofore unseen.

In embodiments described above, the reactive solder material 100 is delivered to an individual die 160. However, in other embodiments, the reactive solder material 100 is delivered to the surface of an entire wafer made up of a plurality of dice as seen at 650 of FIG. 6. The reactive solder material 100 may be delivered to the wafer by a larger patterned preform.

Referring to FIG. 6, in one embodiment the wafer is then placed in a sawing apparatus, and sawed into individual dice 655. The dice are then packaged having a layer of reactive solder material to secure a thermal management device to each die surface as described further herein. Alternatively, in another embodiment, devices are secured to the entire wafer with the reactive solder material by soldering and reflow as described above, prior to sawing.

In still other embodiments, the reactive solder material 100 of FIG. 1 may be applied in alternative manners and during alternate stages of packaging. For example, with additional reference to FIG. 6, the reactive solder material 100 may be introduced to a semiconductor surface by initially applying the reactive solder material 100 to a thermal management device with an appropriate solder preform 660 secured to the semiconductor surface 690. Additionally, in another embodiment where thermal management devices are secured to one another and to the die 160, the reactive solder material 100 may be used as an adhesive thermal interface between the thermal management devices. For example, with added reference to FIG. 3, where an IHS 300 is secured to the die 160 and also accommodates a heat sink, the heat sink may be secured to the IHS 300 with reactive solder material 100 according to processes described above.

Referring to FIG. 6, the flow-chart summarizing certain embodiments described above is shown. With reference to the above description, FIG. 6 summarizes embodiments of securing a thermal management device to a semiconductor surface with a reactive solder material from forming to soldering and solidifying of the reactive solder material.

Reactive solder material embodiments described above bond to the natural silicon based surface of a semiconductor wafer or die. Efficiency of processing is greatly enhanced where no time or materials are required for metallization or addition of flux when curing a solder material to a semiconductor wafer or die.

Embodiments described above include various reactive solder material types. Additionally, methods of application and semiconductor packaging are described. Although exemplary embodiments describe particular reactive solder material types and properties, additional embodiments are possible. For example, reactive solder material types may be employed displaying a variety of conductivity, melting point, and other characteristics to choose from for semiconductor manufacturing. Additionally, many changes, modifications, and substitutions may be made without departing from the spirit and scope of these embodiments.

We claim:

1. An apparatus comprising:
   a semiconductor substrate having a non-metal silicon-based semiconductor surface; and
   a reactive solder material bonded to said surface of said semiconductor substrate, said reactive solder material including:
      a base solder material consisting of indium; and
      an active element material alloyed with the base solder material, wherein the active material is less than about 2% of the reactive solder material and wherein the active element material is selected from the group consisting of hafnium, cerium, titanium, lutetium, iron, cobalt, magnesium, and strontium.

2. The apparatus of claim 1 wherein said semiconductor surface is a backside surface of one of a wafer and a die.

3. The apparatus of claim 2 wherein said die is of a semiconductor package, said semiconductor package including a sealant adjacent a perimeter of said die.

4. The apparatus of claim 3 wherein said sealant is of a material that includes one of a polymer and said reactive solder material.

5. The apparatus of claim 1 wherein said reactive solder material is to bond to said semiconductor surface with a bong strength up to about 2000 psi.

6. An apparatus comprising:
a semiconductor substrate having a non-metal silicon-based semiconductor surface;
a thermal management device; and
a reactive solder material bonded to said semiconductor surface and said thermal management device, said reactive solder material being bonded to said semiconductor substrate at only said non-metal silicon-based semiconductor surface and to act as an interface between said semiconductor substrate and said thermal management device, wherein said reactive solder material comprises:
a base solder material consisting of indium; and
an active element material alloyed with the base solder material, wherein the active material is less than about 2% of the reactive solder material and wherein the active element material is selected from the group consisting of hafnium, cerium, titanium, lutetium, iron, cobalt, magnesium, and strontium.

7. The apparatus of claim 6 wherein said semiconductor surface is a surface on one of a wafer and a die and said thermal management device comprises one of an integrated heat spreader and a heat sink.

8. A semiconductor package, comprising:
a package substrate having a plurality of conductive pads on an upper surface thereof;
a semiconductor die attached to the upper surface of the package substrate, the semiconductor die having a first surface with a plurality of conductive bumps thereon and a second surface that is not metallized, the conductive bumps begin in contact with the conductive pads on the upper surface of the package substrate;
a heat spreader positioned over the semiconductor die; and
a reactive solder material bonded to the semiconductor die and the heat spreader, the reactive solder material including:
a base solder consisting of indium, wherein the base solder is greater than about 98% and less than 100% of the reactive solder material, and
an active element material alloyed with the base solder material, wherein the active material is less than about 2% of the reactive solder material and wherein the active element material is selected from the group consisting of hafnium, cerium, titanium, lutetium, iron, cobalt, magnesium, and strontium.

9. An apparatus comprising:
a semiconductor substrate having a non-metal silicon-based semiconductor surface; and
a reactive solder material bonded to said surface of said semiconductor substrate, said reactive solder material comprising:
a base solder material consisting of indium, wherein the base solder is greater than about 98% and less than 100% of the reactive solder material, and
an active element material alloyed with the base solder material, wherein the active materials is less than about 2% of the reactive solder material and wherein the active element material is selected from the group consisting of hafnium, cerium, titanium, lutetium, iron, cobalt, magnesium, and strontium.

* * * * *